(12) United States Patent
Polasa et al.

(10) Patent No.: US 12,045,109 B2
(45) Date of Patent: Jul. 23, 2024

(54) SYSTEM AND METHOD FOR RECEPTION OF NOISY BMC DATA IN USB PD COMMUNICATION

(71) Applicant: SILICONCH SYSTEMS PVT LTD, Karnataka (IN)

(72) Inventors: Rakesh Kumar Polasa, Karnataka (IN); Shubham Paliwal, Uttar Pradesh (IN); Srivalli Kalyani Mandalapu, Andhra Pradesh (IN); Vinay Sadrhalli Nagendra Patel, Karnataka (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 166 days.

(21) Appl. No.: 17/575,561

(22) Filed: Jan. 13, 2022

(65) Prior Publication Data
US 2023/0010655 A1    Jan. 12, 2023

(30) Foreign Application Priority Data
Jul. 6, 2021    (IN) .............................. 202141030413

(51) Int. Cl.
*G06F 1/26*    (2006.01)
(52) U.S. Cl.
CPC .................... *G06F 1/266* (2013.01)
(58) Field of Classification Search
CPC .. G06F 1/266; G06F 13/4072; H03K 19/0002
See application file for complete search history.

(56) References Cited

U.S. PATENT DOCUMENTS

| | | | |
|---|---|---|---|
| 2011/0013689 A1* | 1/2011 | Yamazaki | H04L 25/4908 375/238 |
| 2014/0062529 A1* | 3/2014 | Ramachandra | G06F 7/501 326/35 |
| 2016/0254902 A1* | 9/2016 | Nagase | G06F 13/4291 375/333 |
| 2017/0052578 A1* | 2/2017 | Agarwal | G06F 1/266 |
| 2018/0091289 A1* | 3/2018 | Kulkarni | H04L 7/033 |
| 2022/0327065 A1* | 10/2022 | Ghosh | G06F 13/4282 |

OTHER PUBLICATIONS

Universal Serial Bus Type-C Cable and Connector Specification Release 2.0, USB 3.0 Promoter Group, Aug. 2019 (373 pages).
Universal Serial Bus Power Delivery Specification, Revision 3.0, Version 2.0, Aug. 29, 2019 (657 pages).

* cited by examiner

*Primary Examiner* — Jaweed A Abbaszadeh
*Assistant Examiner* — Brian J Corcoran
(74) *Attorney, Agent, or Firm* — Procopio, Cory, Hargreaves & Savitch LLP

(57) ABSTRACT

The present disclosure provides a system and method for reception of BMC data in USB PD communication. The system comprises an analog block and a digital block with the digital block further comprising an idle detection mechanism, and a digital controller for rejecting noise and auto correcting of received BMC signal. The BMC data is typically processed by means of varied functions such as comparison by a threshold comparator on the analog block with programmable reference, and other components of the digital block so as to realize aspects such as noise filtering of BMC data by changing the reference dynamically based on comparison of the width of threshold comparator output signal with average signal widths which is computed during the preamble phase of USB PD communications.

14 Claims, 6 Drawing Sheets

SYSTEM AND METHOD FOR RECEPTION OF NOISY BMC DATA IN USB PD COMMUNICATION

CROSS REFERENCE TO RELATED APPLICATION(S)

This application claims the benefit of and priority to India Application Serial No. 202141030413, entitled "SYSTEM AND METHOD FOR RECEPTION OF NOISY BMC DATA IN USB PD COMMUNICATION" and filed on Jul. 6, 2021, which is expressly incorporated by reference herein in its entirety.

TECHNICAL FIELD

The present disclosure generally relates to transceiver circuits, and more specifically, to a bi-phase mark coded (BMC) processing circuit, and a BMC reception method in a noisy BMC communication on configuration channel (CC) lines in Universal Serial Bus (USB) power delivery (PD) communication.

BACKGROUND

Background description includes information that can be useful in understanding the present invention. It is not an admission that any of the information provided herein is prior art or relevant to the presently claimed invention, or that any publication specifically or implicitly referenced is prior art.

Universal Serial Bus (USB) is an industry protocol designed to standardize interfaces between computing devices for communication and for supplying electrical power. The USB protocols have enjoyed widespread adoption in nearly every computing device, and have received tremendous support in terms of technology development with well-established and standardized software infrastructure. USB is one of most common interfaces for connecting a variety of peripherals to computers and providing relatively local and small levels of data transfer. USB interfaces can be found on everything from personal computers and laptops, to peripheral devices, mobile phones, cameras, flash memory sticks, back up hard-drives and many other devices. USB has been implemented in several versions to meet data transfer and power requirements. For example, the versions may include USB 1, USB 1.1, USB 2 and USB 3, etc.

USB is a host-centric plug-and-play bus. A logical USB bus connects USB devices with USB host, using a physical tiered star topology. A system has one host with a hub at the centre of each star. Hubs convert a single attachment point (port) into multiple attachment points. The upstream port of a hub connects the hub towards the host. Each of the downstream ports of a hub allows connection to another hub or a function. Each wire segment is a point-to-point connection between the host and a hub or function, or a hub connected to another hub or function. A function of a USB device to transmit or receive data or control information over the bus and as such provide capabilities to the system. Examples of functions include locator devices, such as a mouse, tablet, or light pen, input devices, such as a keyboard or a scanner, output devices, such as a printer or digital speakers, and a telephony adapter. Each function contains configuration information that describes its capabilities and resource requirements. Before a function can be used, the host must configure it. This configuration includes allocating USB bandwidth and selecting function-specific configuration options.

USB ports are implemented extensively to connect peripheral devices to computing devices such as computer, laptop, personal digital assistant (PDA) etc. USB ports can be implemented for providing charging of various electronic devices and computing devices. There are general peripheral connections connected through USB can be printers, scanners, zip drives, digital cameras, mice, joysticks, modems, speakers, telephones, video phones and any other network connections. A USB cable, according to the USB standard, has a power supply line of +5V, a ground line, and two D+ and D− signal lines. The USB cable, according to the USB standard, can supply a predefined or predetermined current in mA at +5V while transmitting signals. A type of performing charging using this power supply is called USB charging. USB connectors are provided at either end of USB cable to enable connection between any or a combination of computing devices, electronic devices, power adapter etc. through USB ports. USB connectors can be of multiple types such as USB type-A connector, USB type-B connector, USB type-C connector, Mini-USB (of both type-A and type-B), Micro-USB (of both type-A and type-B) etc. According to USB connectors, there can be corresponding USB ports or sockets (such as type-A, type-B, type-C, Mini-USB, Micro-USB etc.).

USB Power delivery (USB PD) is a half-duplex serial communication layered protocol where the communication between the port partners happens through Configuration Channel (CC) lines. The data that is transmitted on CC line is Bi-Phase Mark Coded (BMC) for the ease of communication. In some examples, this may also be referred to as a differential Manchester encoding and this is often used when a need for a synchronized data stream arises in an electronic system or otherwise. The system and method described here addresses the reception of BMC data on the CC line through a mix of digital and analog components.

Efforts have been made in the related or existing art to devise a method and system that can receive BMC data in USB PD communication especially with respect to a low power consumption aspect.

For example, U.S. Pat. No. 9,998,276 B2 discloses a method of controlling a USB Power Delivery System. The disclosure mentions aspects such as that of receiving and processing BMC data, comparison of the BMC data with respect to a reference voltage by means of an analog threshold comparator, noise filtering of the BMC data, and a mechanism that can detect idleness associated with the configuration channel (CC) lines of the USB PD system. While this patent discloses surface level aspects of processing BMC data, it fails to address an effective and self-correcting method and system of reception and processing of BMC data.

Another U.S. Pat. No. 9,715,263 B2 discloses a BMC reception method and a BMC processing with both being associated with a USB PD controller. Particularly, the disclosure includes aspects such as oversampling of BMC data received from a comparator with an in-built feedback mechanism for improvement, validation of BMC data using n-bits pattern, and transmission of processed BMC data to a decoding mechanism. While this patent discloses surface level aspects of processing BMC data, it fails to address an effective method and system of reception and processing of BMC data.

Yet another US Patent document No. U.S. Pat. No. 9,866,239 B1 discloses a method and system of decoding BMC data. While this patent attempts to present a method for decoding BMC data primarily, it also tangentially addresses aspects such as validation of the BMC data using n-bits pattern, and the transmission to the respective decoding mechanism for decoding. Nevertheless, the disclosure is inadequate to solve the problem presented and it fails to address an effective method and system of reception and processing of BMC data.

Therefore, there is a need in the art to provide a reliable and efficient method and system that can receive BMC data in USB PD communication, and that which can overcome the abovementioned limitations. Further, there is a need to provide the system and method with respect to a low power consumption aspect.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities or dimensions of items, and so forth, used to describe and claim certain embodiments of the invention are to be understood as being modified in some instances by the term "about." Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

SUMMARY

It is an object of the present disclosure to provide a method and system for reception of noisy BMC data in USB PD communication. It is another object of the present disclosure to provide a simple and cost effective method and system for reception of BMC data in USB PD communication. It is another object of the present disclosure to provide a reliable, efficient and auto-correcting method and system for reception of BMC data in USB PD communication. It is another object of the present disclosure to provide a robust method and system for reception of BMC data in USB PD communication.

The present disclosure relates to transceiver circuits, and more specifically, to a BMC processing circuit, and a BMC reception method in a noisy BMC communication on CC lines in USB PD communication.

This brief summary introduces simplified concepts of a system for time bound availability check of an entity, which are further described below in the detailed description. This brief summary is not intended to identify key or essential features of the claimed subject matter, nor is it intended for use in determining/limiting the scope of the claimed subject matter.

An aspect of the present disclosure pertains to a bi-phase mark coding (BMC) data processing system wherein the BMC data may be received over configuration channel (CC) lines of a USB PD system. The system may include a receiver having an analog block and a digital block, with the digital block further comprising an digital controller running at predetermined frequency typically a multiple of unit interval (UI) frequency defined by the USB-PD specification and a plurality of idle detection blocks. The analog block includes one threshold comparator with respect to a reference voltage generated by a reference voltage generation block, the act of comparing the BMC data with the reference voltage includes filtering noise associated with the BMC data through feedback from the digital block based on a width comparison of BMC data output into the digital block with an average signal width, said average signal width is computed during a preamble phase of USB PD communications. The digital controller, configured to provide selection bits to a multiplexer for outputting the reference required for BMC data arriving on the CC pin, and an output from the multiplexer may be provided to the threshold comparator of BMC data. The plurality of idle detection blocks configured to continuously monitor one selected (configuration channel) CC line associated with the USB PD system, wherein the BMC data is received over configuration channel CC lines of a USB PD system.

In an embodiment, the receiver may further include a noise rejection mechanism configured to reject noise within a predefined magnitude on BMC data over one of the CC line of the USB PD system with predefined ground shift through configurable reference controlled comparator adjusted through digital feedback.

In an embodiment, the threshold comparator for the receiver may have a separate hysteresis range with a separate reference voltage generation block generating a plurality of reference voltages with predefined step size between high and a low voltage levels of BMC signalling as defined in USB-PD specification, wherein the reference voltage for the threshold comparator may be auto adjusted depending on the receiver output duty cycle based on feedback from the digital controller.

In an embodiment, the reference voltage generation block may provide reference voltages in a predefined range with a predetermined step, and wherein the multiplexer reference output controls the reference voltages of the BMC receiver threshold comparator during reception of noisy BMC data on the selected CC line.

In an embodiment, the select input to the multiplexer to select a reference voltage generated by reference generator block may be decided by the digital controller on the basis of the width comparison between BMC data output from the reference comparator and the average signal width (threshold of ranges for bits "0" and "1" respectively) computed during the preamble phase of USB PD communications leading to rejection of noise of the received BMC signal on one of the selected CC lines.

In an embodiment, the digital controller of the receiver running at a predetermined frequency may correspond to a multiple of UI frequency defined by the USB-PD specification, starts a counter as soon as an edge of BMC data may be detected to compute a signal width till the subsequent edge and compare it with the average signal width (threshold of ranges for bits zero "0" and one "1" respectively), to decide for the reference voltage adjustment required for correcting the received BMC signal widths through selection of a reference.

In an embodiment, the CC line is monitored for idleness during data reception phase.

In an embodiment, the selected CC line input may be sent to one or more odd-numbered low power threshold comparators with fixed reference voltages and the output of each said threshold comparator may be sent to a separate idle detection block which indicates a CC line as idle or non-idle, wherein the CC line may be declared idle or non-idle based on a majority function of the outputs of each idle detection block.

In an embodiment, each idle detection block may include at least one or more odd-numbered idle detectors, each idle detector comprising an edge detector, a counter, at least three sets of shift register, and an adder, and the idle detection mechanism may run at a multiple of predetermined frequency typically a multiple of UI frequency defined by the USB-PD specification.

In an embodiment, if the counter may overflow before at least three edges are detected, the CC line may be declared as idle, and wherein the CC line may be declared non-idle based on the outputs of CC line being non-idle from the output of the majority of idle detector blocks, the output of the majority of the idle detector blocks undergoing a majority function for detecting non-idleness of CC line.

In an embodiment, a clock input to the digital portion of the noisy BMC data receiver may start running and the receiver may be activated based on CC line being declared non-idle by the idle detection mechanism, and the system may be configured to manage power by means of the digital block so as to realize low power consumption during idle detection and auto-correcting noisy BMC data reception stage of operation.

In an embodiment the analog block maintain the input impedance of the systems may be maintained at a minimum of 1 Mohm for both the CC lines as per the USB PD specification.

An aspect of the present disclosure pertains to a BMC data processing method for reception of noisy BMC data. The method may include the steps of: detecting an idle configuration channel (CC) line associated with the USB PD system, wherein the detection of the idle CC line may occur when one or more odd-numbered threshold comparators compare BMC data with respect to a predefined reference voltage, wherein the output of the one or more odd-numbered threshold comparators may be sent to an idle detection block connected to each odd-numbered threshold comparator; declaring the CC line idle or non-idle depending on an output from the plurality of idle detection blocks, the output from the plurality of idle detection blocks undergoing a majority function; indicating idle or non-idle respectively, the act of enabling auto-correcting receiver post line declaration of non-idle depends on an act of comparing the width of BMC data output from the reference comparator with an average signal width computed during a preamble phase of USB PD communications to select appropriate reference of the reference comparator by providing the selection bits to a multiplexer to filter noise associated with the BMC data arriving at the CC pin; configuring a digital controller to provide selection bits to a multiplexer for outputting the reference required for BMC data arriving on the CC pin, and an output from the multiplexer may be provided to the threshold comparator of BMC data; monitoring by the idle detection block, the CC line associated with the USB PD system, wherein the BMC data is received over the CC line of a USB PD system.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The diagrams are for illustration only, which thus is not a limitation of the present disclosure, and wherein.

DETAILED DESCRIPTION

Figure 1:
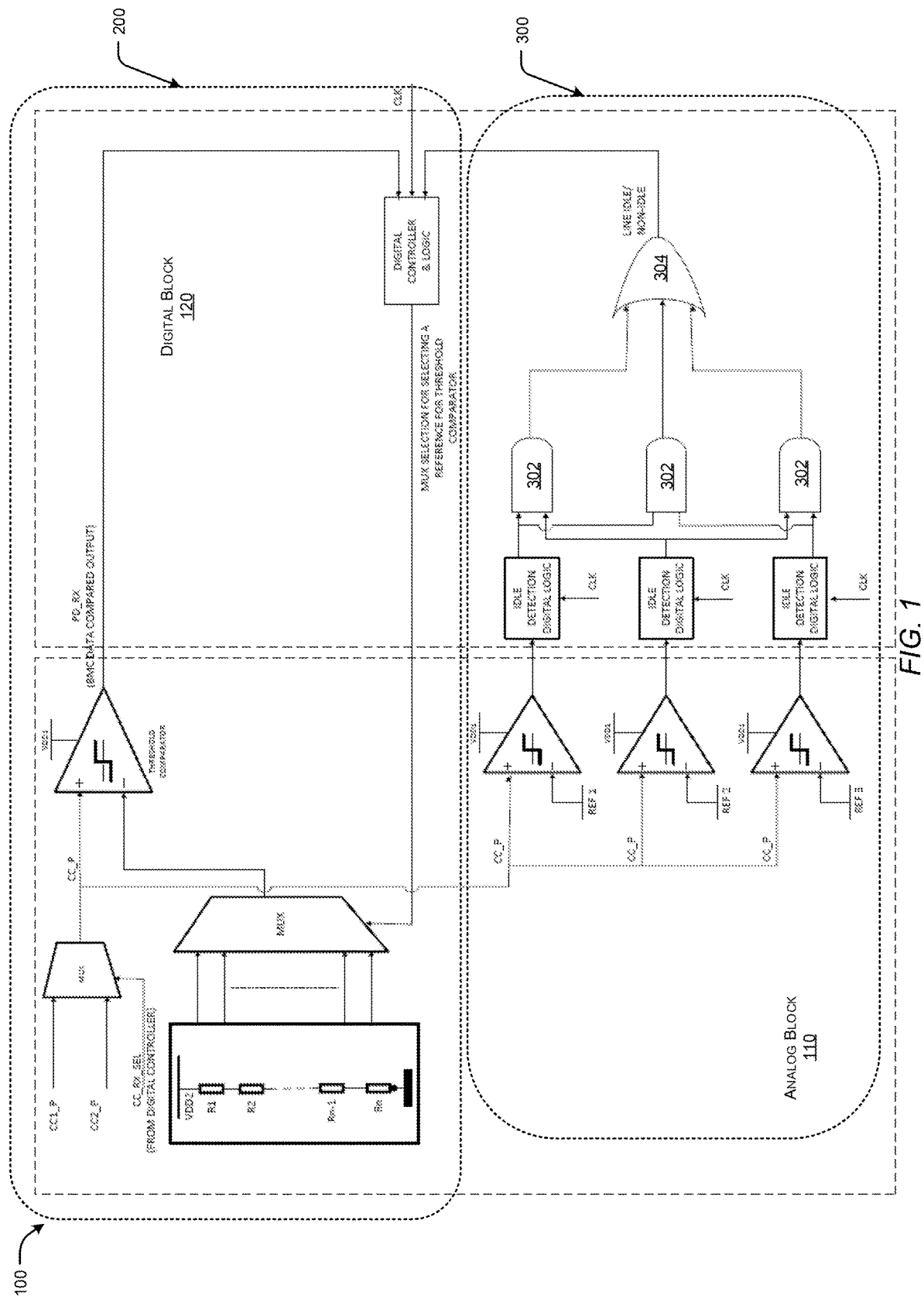
FIG. 1 illustrates an exemplary representation of the proposed receiver in accordance with an embodiment of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Embodiments of the present invention may be provided as a computer program product, which may include a machine-readable storage medium tangibly embodying thereon instructions, which may be used to program a computer (or other electronic devices) to perform a process. The term "machine-readable storage medium" or "computer-readable storage medium" includes, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware). A machine-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

The present disclosure generally relates to transceiver circuits, and more specifically, to a BMC reception method in a noisy BMC communication on CC lines in USB PD communication and program with low power consumption.

FIG. 1 illustrates an exemplary representation of a receiver in accordance with an embodiment of the present disclosure.

Figure 2:
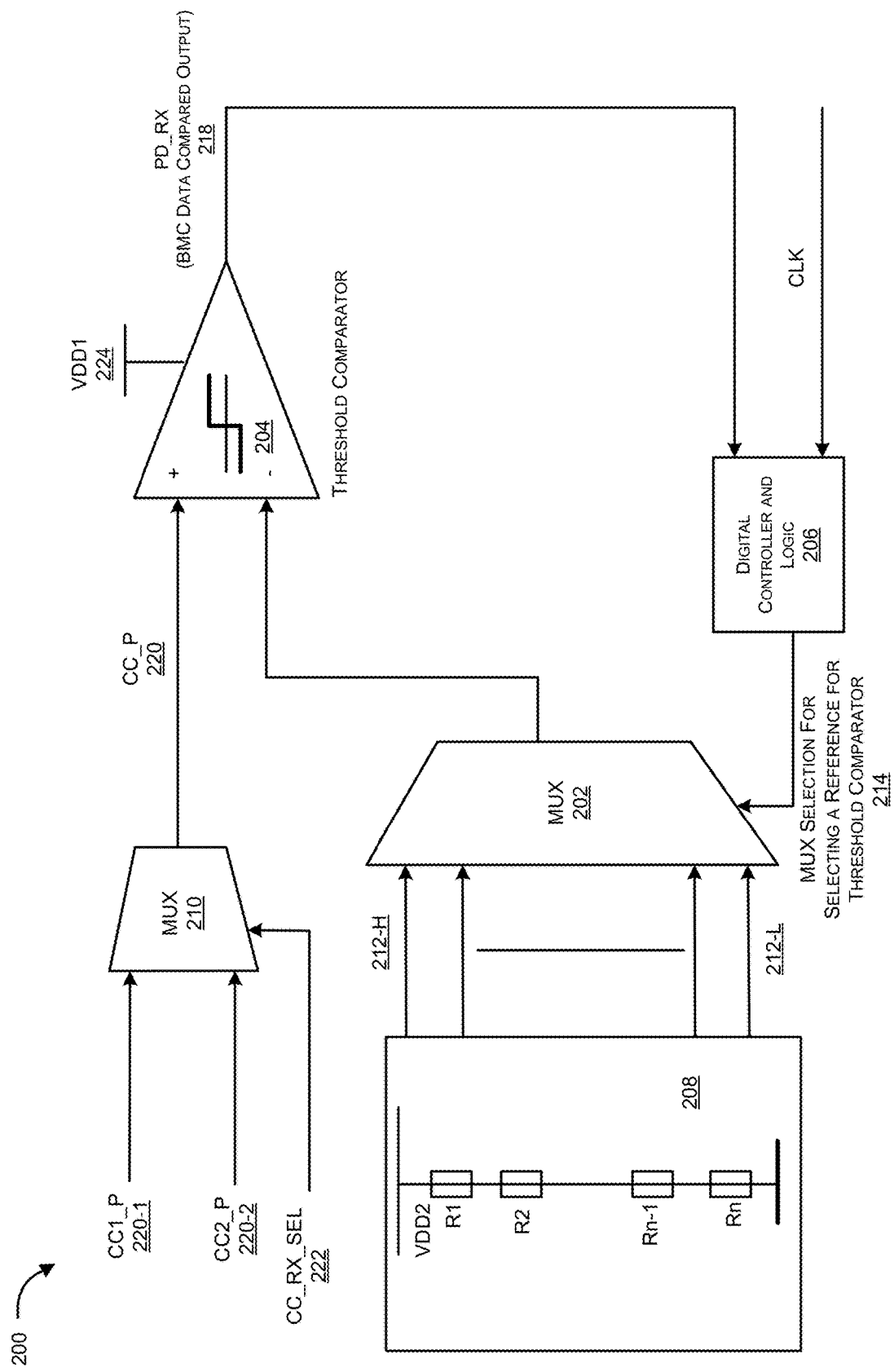
FIG. 2 illustrates a typical logic structure that allows the analog block to continuously monitor, receive the BMC data on the CC lines of a given USB PD system and reject noise by auto-correcting mechanism, in accordance with an embodiment of the present disclosure.

FIG. 2 shows an example logic structure that allows an analog block to continuously monitor, receive the BMC data on the CC lines of a given USB PD system and reject noise by auto-correcting mechanism in accordance with an embodiment of the present disclosure.

Figure 3:
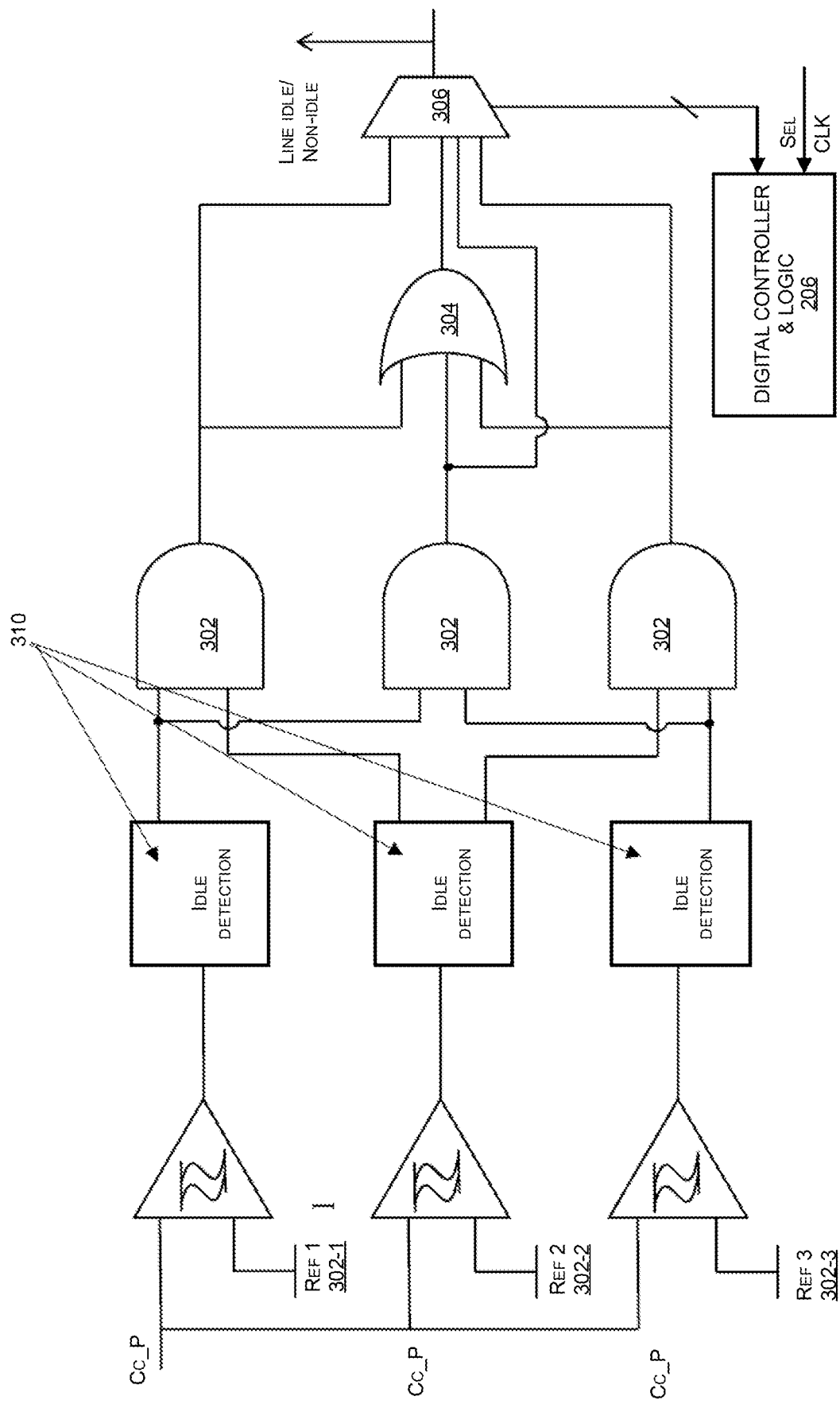
FIG. 3 illustrates the logic circuit representation of functions of the idle detection mechanism of the digital block, in accordance with an embodiment of the present disclosure.

FIG. 3 illustrates an example logic circuit representation of functions of the idle detection mechanism of the digital block in accordance with an embodiment of the present disclosure.

Referring to FIG. 1, in an aspect, at an overview level, a system 100 may include an analog block 110 and a digital block 120. The logic structure may allow the analog block 110 to continuously monitor the CC lines of a given USB PD system. The analog block 110 may include a block 200, and the block 200 may include a threshold comparator 204 (FIG. 2) that may be configured to compare BMC data 220 with respect to a reference voltage 226 generated by a reference voltage generation block 208, the act of comparing the BMC data width of BMC data output from a reference comparator with average signal widths, the reference comparator may be programmable but not limited to it. The BMC data output may be computed during a preamble phase of USB PD communications in digital controller 206 to select appropriate reference of the programmable reference comparator 204 by providing the selection bits 214 to a multiplexer 202 to filter noise associated with the BMC data arriving on the CC pin with digital controller as part of the digital block 120. The preamble phase may include the BMC signal width information which the receiver uses for the further packet reception as defined in the USB PD specification. The digital block 120 includes an idle detection mechanism, and a digital controller 206 configured to a selection signal to a multiplexer 202, wherein an output 226 from the multiplexer is provided to the threshold comparator 204. The analog block 110 may continuously monitor the CC lines of a given USB PD system. As shown in FIG. 2, the BMC data receiver (RX) i.e. the digital block 120 receives USB PD data i.e. BMC data 220 over one of the CC lines (220-1 or 220-2) which are multiplexed on which direct current (DC) level is maintained as part of the connection process. The selection of a given CC line (220-1 or 220-2) may be performed by means of a receiver select line 222 which is also generated by the digital control block. In other embodiments, the selection can also be performed by means of a firmware code.

In an aspect, the threshold comparator 204 (which may also be referred to as the comparator 204) based receiver may be configured with programmable hysteresis range to detect the received BMC data 220 appropriately. Reference voltage generation block 208 may provide a plurality of reference voltages in a predefined range with a predetermined step. In an exemplary embodiment, the predefined range with the predetermined step may correspond but not limited to 100 mV to 1.2V with at least 50 mV step but not limited to it. Depending upon high voltage reference 212-H and low voltage reference 212-L, the reference voltage generation block 208 may provide multiple output voltages and programmable hysteresis to the threshold comparator 204 as a reference voltage controlled by the multiplexer 202. The multiplexer 202 may be configured to select reference voltage from the reference voltage generation block 208 depending upon the comparator 204 output signal width comparison with an average signal width which is computed during the preamble phase of USB PD communications in the digital controller 206. The comparator 204 may compare an input BMC data from the CC line with respect to the reference voltage generated from the reference voltage generation block 208 and may provide the BMC data output to the digital controller block 206. The reference voltage for the comparator may be auto corrected depending on the receiver output duty cycle based on feedback from the digital controller 206.

In an embodiment, the receiver may further include a data reception mechanism through which the BMC data comprising noise within a predefined magnitude and a predefined ground shift is received over the one or more CC lines of the USB PD system. The receiver may detect a line idle through the idle detection mechanism for the BMC data comprising noise within the predefined magnitude and the predefined ground shift in a predefined frequency range. The predefined magnitude and the predefined ground shift may correspond but not limited to a magnitude of 300 mVpp and +/−250 mV ground shift. The receiver further includes a noise rejection mechanism configured to reject a BMC data having noise with a magnitude of more than the predefined magnitude and the predefined ground shift, that is more than 300 mVpp but not limited to it.

In an embodiment, the idle detection mechanism has one or more odd numbered threshold comparators with separate hysteresis ranges with separate predefined reference voltages. The typical low value may correspond to 0.35V but not limited to it and a typical high value may correspond to 0.75V but not limited to it. An output of each of the threshold comparator may be sent to a separate idle detection block which indicates a CC line as idle or non-idle.

In an embodiment, the idle detection mechanism 310 may include at least one or more odd numbered idle detector blocks, each said idle detector block comprising an edge detector, a counter, at least three sets of shift register, and an adder. The idle detection mechanism runs at a predetermined frequency defined by the USB-PD specification which may be typically at least 10x of the UI clock frequency (300 KHz) but not limited to it. If the counter overflows before at least three edges are detected, the CC line may be declared as idle. The CC line may be declared non-idle based on the outputs of CC line being non-idle from majority of one or more odd numbered idle detectors thereby implementing a majority function (including AND gates 302, OR gate 304. and a 4:1 multiplexer 306) for detecting non-idleness of CC line.

In an embodiment, a clock input to the receiver may start running and the receiver may then be activated based on CC line being declared non-idle by the idle detection mechanism.

In an embodiment, the system may be configured to manage power by means of the digital block so as to realize low power consumption during different stages of operation.

In addition to the DC ground shift, the BMC data receiver is expected to be immune to 300 mV p-p noise coupled onto the CC lines. The comparator-based receiver scheme with programmable hysteresis range detects the received BMC data appropriately and gives better control on the reference used for incoming BMC data.

Referring to the idle detection mechanism 310 at FIG. 3, the mechanism 310 detects idleness on the CC line based on definition provided in USB PD specification. It maintains a rolling idle detection counter which starts whenever an edge is detected based on indication from the comparator in FIG. 3. The counter over-flow value is controlled through firmware code. As soon as an edge is detected on the CC line, the counter starts running. On the subsequent edge detection, the counter is restarted, and the last value of the counter is stored in a shift register. On the third edge detection, the counter is reloaded with 1 and the sum of the 2 shift registers and counter is compared with a pre-computed stored threshold sum value. If the counter overflows before 3 edges are detected the line is declared as idle thereby rejecting the noise in the idle detection phase of BMC traffic In a way of example and not as a limitation, in case of a three independent idle detection block 310 as shown in FIG. 3, the primary function is to infer idleness on the CC line of USB Type C connector. With the capability to bypass, there is an option to select either of the three available mechanisms 310 through computer code. The references shown in FIG. 3 are also configurable through computer code.

Figure 4:
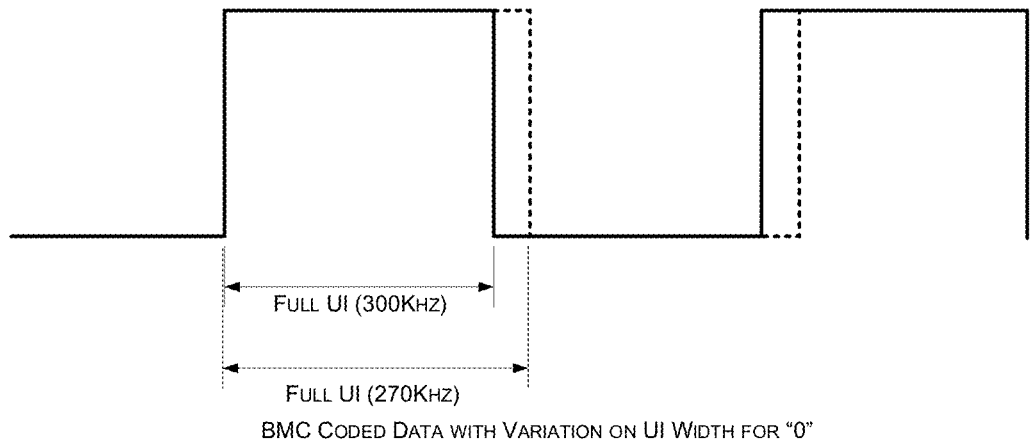
FIG. 4 illustrates representation of BMC data with each showing variations of BMC coded data in UI period with each having "0".
Figure 5:
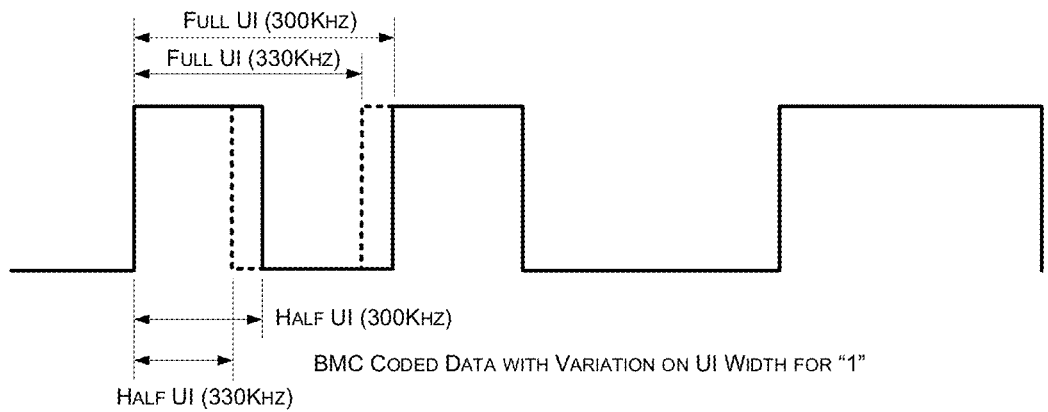
FIG. 5 illustrates representation of BMC data with each showing variations of BMC coded data in UI period with each having "1".

FIG. 4 and FIG. 5 show example representations of BMC data with each showing variations of BMC coded data in unit interval (UI) period with each having "0" and "1" respectively. The UI threshold comparator assesses possible variations in UI and the counter values are compared with pre-stored values in a BMC coded UI signals corresponding to maximum UI possible (BMC Frequency at 270 KHz) and minimum half UI possible for detecting the BMC coded "0" and "1" with the values corresponding to the detected "0" and "1".

Figure 6:
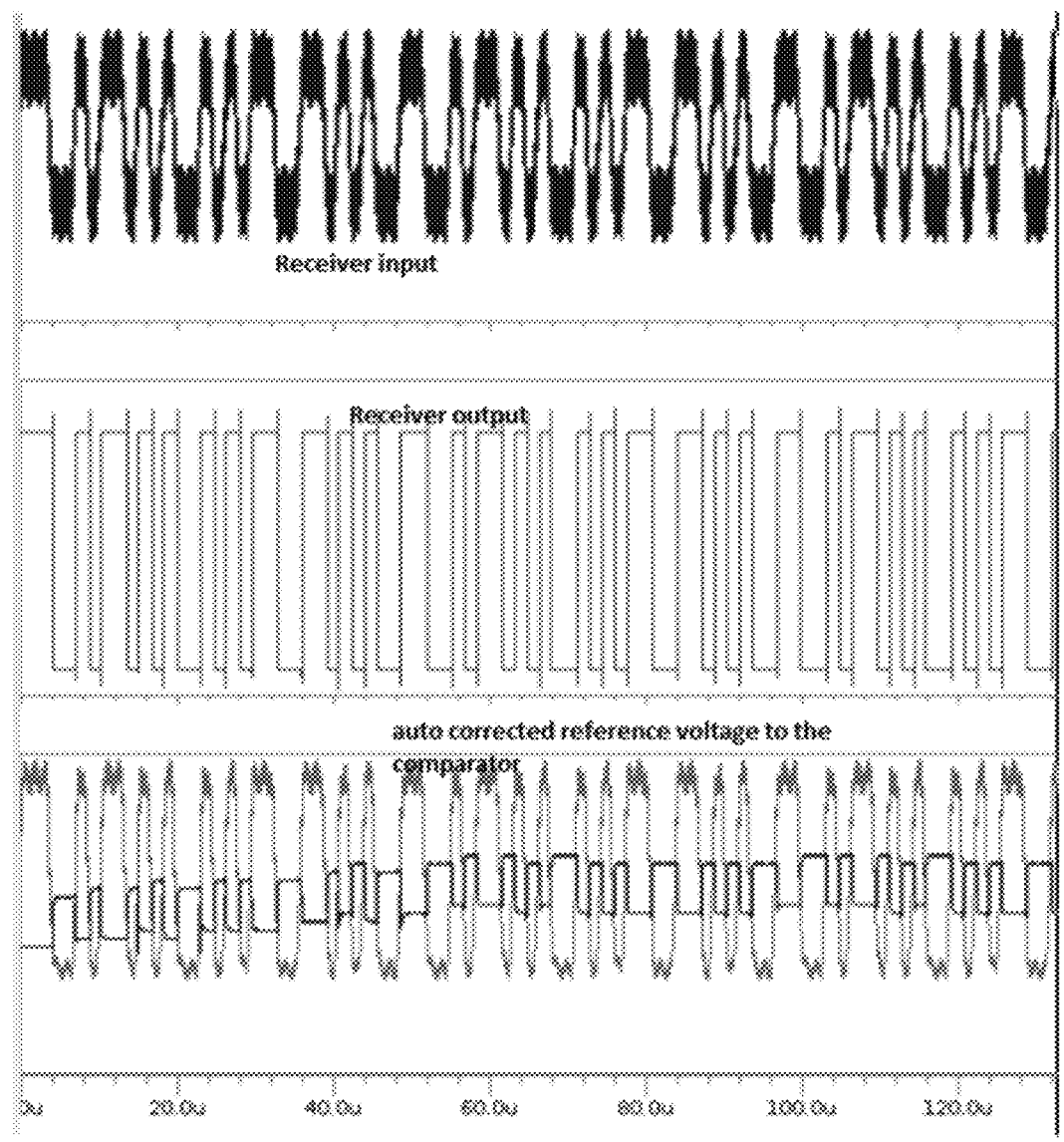
FIG. 6 illustrates a waveform data associated with receiver output with auto corrected reference voltage, in accordance with an embodiment of the present disclosure.

FIG. 6 shows an example of data associated with receiver output with auto corrected reference voltage, in accordance with an embodiment of the present disclosure. The comparator-based receiver scheme with programmable hysteresis range detects the received BMC data appropriately. Reference voltage generation block will provide different reference voltages from 100 mV to 1.2V with 50 mV step. Depending upon high voltage reference and low voltage reference, reference voltage generation block provides multiple output voltages and programmable hysteresis to the comparator as a reference voltage is controlled by multiplexer control logic. Digital controller selects a reference voltage from the reference voltage generation block through the multiplexer selection depending upon comparator output based on signal width computed from received BMC data from comparator output with average signal widths which is computed during the preamble phase of USB PD communications. Comparator circuit compares the input data from CC line with respect to reference voltage generated from reference voltage generation block and provides BMC data output to digital controller.

In an aspect, once the line has been inferred to be as non-idle, the receiver (noise rejection and data reception) comes into action based on receiver comparator output. The clock input to receiver starts running based on CC line being declared non-idle by the idle detection block. On receiving the edge of the data, a counter starts running and it counts till the next edge of data is not received. On reception of next edge, the counter value is compared with the with an average signal width for the bit "0" and "1" respectively which is computed during the preamble phase of USB PD communications. If the counter value is not falling in the threshold range, then threshold to the receiver comparator is changed depending on the counter value position in comparison to the threshold range of values. For example, if threshold range is 5 to 15 and the counter value is 3, then the comparator reference is lowered and set to 0.35V. Similarly, if the counter value comes to be as 18, the comparator threshold is changed to 0.75V. The above is done to reject the noise signals on the CC line and detect correct data appropriately. The receiver clock is a multiple of UI clock for all the computation and comparison done above. The idle detection block is always running concurrently to noise rejection block and data reception block.

In an aspect, input impedance of the receiver should be minimum of 1 Mohm but not limited to it.

Figure 7:
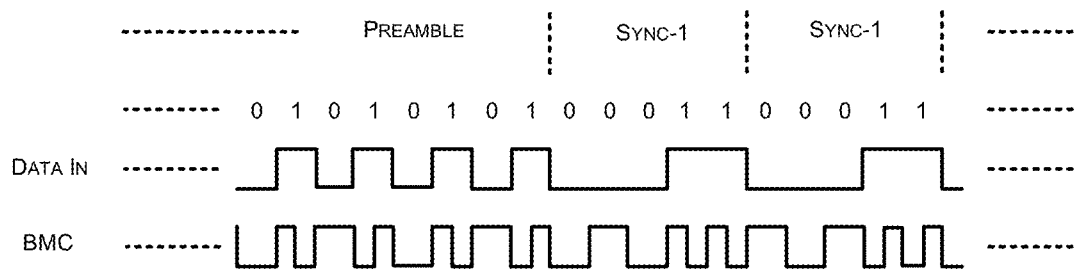
FIG. 7 illustrates a packet format for USB PD specification indicating preamble and data phases wherein the preamble phase is used for training the receiver for the incoming BMC data frequency, in accordance with an embodiment of the present disclosure.

FIG. 7 shows an example packet format for USB PD specification indicating preamble and data phases. The preamble phase may be used for training the receiver for the incoming BMC data frequency, in accordance with an embodiment of the present disclosure.

Figure 8:
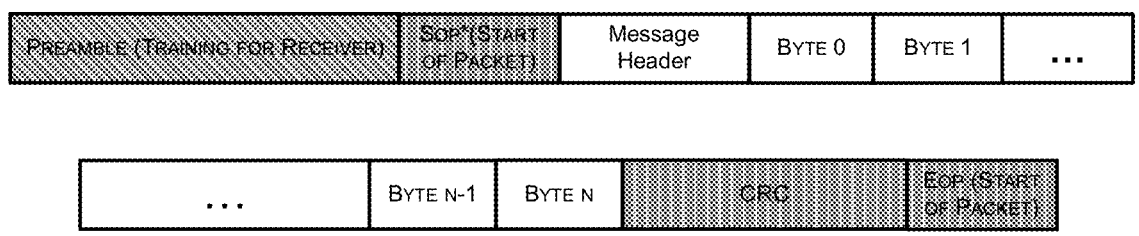
FIG. 8 illustrates a BMC decoding of the preamble and subsequent USB PD data in accordance with an embodiment of the present disclosure.

FIG. 8 shows an example BMC decoding of the preamble and subsequent USB PD data in accordance with an embodiment of the present disclosure.

Thus, embodiments pertaining to the present disclosure afford the following benefits of comparing the received BMC data with a reference voltage using an analog comparator having auto adjustable reference voltage with hysteresis of 350 mV, for removing noise from the BMC data. Aspects of the present disclosure provide a method and system for reception of BMC data in USB PD communication. Aspects of the present disclosure provide a simple, auto-correcting and cost-effective method and system for reception of BMC data in USB PD communication. Aspects of the present disclosure provide a reliable and efficient method and system for reception of BMC data in USB PD communication. Aspects of the present disclosure provide a robust method and system for reception of BMC data in USB PD communication.

The above-mentioned method is envisioned to be performed using appropriate physical devices that may be appreciated by a person skilled in the art. As such all physical devices comprising respective various physical materials serve their respective functions and all such materials and their respective manufacturing methods are intended to be covered by this disclosure.

Thus, it will be appreciated by those of ordinary skill in the art that the diagrams, schematics, illustrations, and the like represent conceptual views or processes illustrating systems and methods embodying this invention. The functions of the various elements shown in the figures can be provided through the use of dedicated hardware as well as hardware capable of executing associated software. Similarly, any switches shown in the figures are conceptual only. Their function can be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named.

While the foregoing describes various embodiments of the invention, other and further embodiments of the invention can be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

What is claimed is:

1. A bi-phase mark coding (BMC) data processing system for reception of noisy BMC data, the BMC data processing system comprising:
   a receiver including an analog block and a digital block;
   the analog block comprising:
      one reference threshold comparator configured to compare BMC data with a reference voltage generated by a reference voltage generation block, the comparison of the BMC data with the reference voltage includes filtering noise associated with the BMC data through feedback from the digital block based on a width comparison of BMC data output into the digital block with an average signal width, said average signal width is computed during a preamble phase of an Universal Serial Bus (USB) power delivery (PD) communication;
      one or more odd-numbered threshold comparators configured to compare the BMC data for an idle detection of a configuration channel (CC) line; and
   the digital block comprising:
      a processor that provides selection bits to a multiplexer, based on a signal width of an output of the reference threshold comparator compared with said average signal width, for outputting the reference voltage required for the BMC data arriving on a CC line, and an output from the multiplexer is provided to the reference threshold comparator;
      a plurality of digital circuits, the analog block continuously monitoring one CC line associated with a USB PD system, wherein the BMC data is received over CC lines of the USB PD system,
      wherein the CC line is declared idle or non-idle depending on an output from a majority of the plurality of digital circuits indicating idle or non-idle respectively.

2. The BMC data processing system as claimed in claim 1, wherein said receiver further rejects noise within a predefined magnitude on the BMC data over one of the CC lines of the USB PD system with predefined ground shift through a configurable reference-controlled comparator adjusted through digital feedback.

3. The BMC data processing system as claimed in claim 1, wherein the reference threshold comparator for the receiver has a separate hysteresis range with a separate reference voltage generation block generating a plurality of reference voltages with predefined step sizes between high and a low voltage levels of BMC signaling, and
   wherein the reference voltage for the reference threshold comparator is auto adjusted depending on a receiver output duty cycle based on feedback from the processor.

4. The BMC data processing system as claimed in claim 3, wherein the reference voltage generation block provides reference voltages in a predefined range with a predetermined step, and wherein the multiplexer reference output controls the reference voltages of the BMC receiver the reference threshold comparator during reception of noisy BMC data on the CC line.

5. The BMC data processing system as claimed in claim 1, wherein a select input to the multiplexer is used to select one of the reference voltages generated by the reference generator wherein the select input is generated by the processor based on width comparison between BMC data output from the reference comparator and the average signal width computed during the preamble phase of USB PD communications leading to rejection of noise of the received BMC signal on one of the CC lines.

6. The BMC data processing system as claimed in claim 5, wherein the processor of the receiver running at a predetermined frequency, wherein said predetermined frequency corresponds to a multiple of UI frequency, starts a counter as soon as an edge of the BMC data is detected to compute the signal width till subsequent edge and compare it with the average signal width to decide for reference voltage adjustment required for correcting the received BMC signal widths through selection of a reference.

7. The BMC data processing system as claimed in claim 6, wherein a clock input to a digital portion of the noisy BMC data receiver starts running and the receiver is activated based on CC line being declared non-idle by the idle detection block.

8. The BMC data processing system as claimed in claim 1, wherein the CC line is monitored for idleness during a data reception phase.

9. The BMC data processing system as claimed in claim 1, wherein the CC line is sent to one or more odd-numbered low power threshold comparators of the one or more odd-numbered threshold comparators with fixed reference voltages and output of each said one or more odd-numbered low power threshold comparators is sent to a separate idle detection block which indicates a CC line as idle or non-idle, wherein the CC line is declared idle or non-idle based on a majority function of the outputs of each of the plurality of idle detection block.

10. The BMC data processing system as claimed in claim 1, wherein each of plurality of idle detection block includes at least one odd-numbered idle detector, each of the at least one odd-numbered idle detector comprising an edge detector, a counter, at least three sets of shift register, and an adder, and
   wherein the idle detection block runs at a multiple of UI frequency defined by.

11. The BMC data processing system as claimed in claim 1, wherein in the idle detection block, if a counter overflows before at least three edges of on the CC line are detected, the CC line is declared as idle, and wherein the CC line is declared non-idle based on the outputs of the CC line being non-idle from the output of plurality of idle detector blocks, the plurality of the digital circuits undergoing a majority function for detecting non-idleness of CC line.

12. The BMC data processing system as claimed in claim 1, wherein the system manages power by the digital block so as to realize low power consumption during idle detection and auto-correcting noisy BMC during a data reception stage of operation.

13. The BMC data processing systems as claimed in claim 1, wherein the analog block maintains an input impedance of the systems at a minimum of 1 Mohm for both the CC lines.

14. A bi-phase mark coding (BMC) data processing method for reception of noisy BMC data, the method comprising:
   detecting an idle configuration channel (CC) line associated with a Universal Serial Bus (USB) power delivery (PD) system, wherein the detection of the idle CC line occurs when one or more odd-numbered threshold comparators compare BMC data with respect to a predefined reference voltage, wherein an output of the one or more odd-numbered threshold comparators is sent to an idle detection block connected to each of the one or more odd-numbered threshold comparators;
   declaring the CC line to be idle depending on an output from a plurality of digital circuits, the output from the plurality of digital circuits undergoing a majority function;
   indicating the CC line idle, wherein indicating the CC line idle is based on enabling auto-correcting receiver post line declaration of non-idle by comparing width of BMC data output from a reference threshold comparator with an average signal width computed during a preamble phase of USB PD communications to select appropriate reference of the reference comparator by providing selection bits to a multiplexer to filter noise associated with the BMC data arriving at a CC pin;
   controlling, by a processor, to provide the selection bits to a multiplexer, based on a signal width of an output of the reference threshold comparator compared with said average signal width, for outputting the reference required for the BMC data arriving on the CC pin, and an output from the multiplexer is provided to the reference threshold comparator of BMC data; and
   monitoring the CC line associated with the USB PD system,
   wherein the BMC data is received over the CC line of a USB PD system.

* * * * *